US009673350B2

(12) United States Patent
Boulard et al.

(10) Patent No.: US 9,673,350 B2
(45) Date of Patent: Jun. 6, 2017

(54) SEMICONDUCTOR COMPONENT AND PROCESS FOR FABRICATING A SEMICONDUCTOR COMPONENT (71) Applicant: COMMISSARIAT A L'ENERGIE ATOMIQUE ET AUX ENE ALT, Paris (FR)

(72) Inventors: Francois Boulard, Grenoble (FR); Olivier Gravrand, Fontanil Cornillon (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/420,814

(22) PCT Filed: Aug. 12, 2013

(86) PCT No.: PCT/EP2013/066779
§ 371 (c)(1),
(2) Date: Feb. 10, 2015

(87) PCT Pub. No.: WO2014/026941
PCT Pub. Date: Feb. 20, 2014

(65) Prior Publication Data
US 2015/0207027 A1 Jul. 23, 2015

(30) Foreign Application Priority Data
Aug. 14, 2012 (FR) ...................... 12 57810

(51) Int. Cl.
*H01L 33/00* (2010.01)
*H01L 23/00* (2006.01)
(Continued)

(52) U.S. Cl.
CPC .......... *H01L 33/0083* (2013.01); *H01L 24/10* (2013.01); *H01L 27/1465* (2013.01);
(Continued)

(58) Field of Classification Search
USPC ............................ 257/331, 758, E25.032, 98
See application file for complete search history.

(56) References Cited

U.S. PATENT DOCUMENTS

| 5,376,558 A | 12/1994 | Sudo et al. |
| 5,449,944 A | 9/1995 | Sudo et al. |

(Continued)

FOREIGN PATENT DOCUMENTS

| EP | 1 280 207 | 1/2003 |
| WO | 2008 043786 | 4/2008 |
| WO | 2010 074288 | 7/2010 |

OTHER PUBLICATIONS

U.S. Appl. No. 14/420,020, filed Nov. 18, 2014, Boulard, et al.
(Continued)

*Primary Examiner* — Timor Karimy
(74) *Attorney, Agent, or Firm* — Oblon, McClelland, Maier & Neustadt, L.L.P.

(57) ABSTRACT

A semi-conducting component including a semi-conducting layer of a first conductivity type including a plurality of semi-conducting zones of a second conductivity type opposite that of the semi-conducting layer, and an insulating layer. The component further includes a first bias mechanism configured to bias the semi-conducting layer and a second bias mechanism configured to bias a semi-conducting zone. The first bias mechanism includes a conducting layer in contact with the insulating layer and which includes passageways for each second bias mechanism with the spacing between the conducting layer and the second bias mechanism which is located facing the corresponding semi-conducting zone.

13 Claims, 8 Drawing Sheets

(51) Int. Cl.
    *H01L 33/46*     (2010.01)
    *H01L 33/62*     (2010.01)
    *H01L 27/146*     (2006.01)

(52) U.S. Cl.
    CPC .. *H01L 27/14636* (2013.01); *H01L 27/14689* (2013.01); *H01L 33/46* (2013.01); *H01L 33/62* (2013.01); *H01L 27/1464* (2013.01); *H01L 27/14634* (2013.01); *H01L 2924/01049* (2013.01); *H01L 2924/12043* (2013.01)

(56) References Cited

U.S. PATENT DOCUMENTS

| | | | |
|---|---|---|---|
| 6,005,276 A | 12/1999 | Forrest et al. | |
| 6,489,653 B2 * | 12/2002 | Watanabe | H01L 29/0847 257/341 |
| 2003/0034496 A1 | 2/2003 | Yoneta et al. | |
| 2010/0010779 A1 | 1/2010 | Rostaing et al. | |
| 2014/0312446 A1 | 10/2014 | Gravrand et al. | |
| 2015/0008551 A1 | 1/2015 | Gravrand et al. | |

OTHER PUBLICATIONS

Henini, M., et al., "Handbook of Infrared Detection Technologies", (2015), p. 297.
Foreign Preliminary Search Report Issued Apr. 22, 2013 in French Patent Application No. 12 57810 Filed Aug. 14, 2012.
International Search Report Issued Nov. 14, 2013 in PCT/EP13/066779 Filed Aug. 12, 2013.

* cited by examiner

PRIOR ART

FIG. 1

PRIOR ART

SEMICONDUCTOR COMPONENT AND PROCESS FOR FABRICATING A SEMICONDUCTOR COMPONENT

TECHNICAL FIELD

The invention relates to the field of optoelectronics and optoelectronic semi-conducting components.

Regardless of whether it relates to light emission or light measurement, optoelectronic components have become indispensable.

Indeed, the performance of such components, for an occupied volume which is low, as to their emission efficiency, for light emitting components, or as to their sensitivity for light sensing components, is hardly achievable with technologies other than those of optoelectronics.

The improvement in the emission efficiencies and the signal-to-noise ratio remains however a constant issue of microelectronics.

The invention more precisely relates to a semi-conducting component and a method for manufacturing such a component.

STATE OF PRIOR ART

Among optoelectronic components, some of them, as the arrays of optoelectronic sensors or screen forming light emitting diodes, include an arrangement of a plurality of optoelectronic structures operating in parallel and independently from each other.

In such components, each of the structures being a dipole type structure provided in a semi-conducting support, it is necessary to provide a bias network adapted to bias individually each of the structures. Such a network thus includes a first bias means adapted to bias the first pole of each of the structures and second bias means each adapted to bias, with respect to the bias voltage provided by the first bias means, the second pole of one of the structures.

In order to both simplify the steps of manufacturing the structures and the network enabling each of the structures to be individually biased, it is known to provide the structures in a semi-conducting layer of a first type of conductivity forming a first zone common to each of the structures, the formation of a zone of a second type of conductivity opposite to the first type of conductivity enabling each of the structures to be formed. With such a configuration, the semi-conducting layer forms the first pole of each of the structures whereas each semi-conducting zone forms the second pole of the structure with which it is associated. Thus, the first zone of each of the structures being common, a single contact is sufficient to bias the first pole of all the structures, the second pole of each of the structures being individually biased.

However, such a possibility requires that the semi-conducting layer be sufficiently conducting in order to ensure that the bias of the first poles of each of the structures is homogenous. Thus, such a configuration is not compatible with some semi-conductors, such as low energy band gap semi-conductors, which do not allow a high doping level for at least one conduction type. Thereby, one can mention for example the mercury-cadmium tellurides $Cd_xHg_{1-x}Te$ for which it is difficult to have a conductivity the majority carriers of which are of the hole type.

Figure 1:
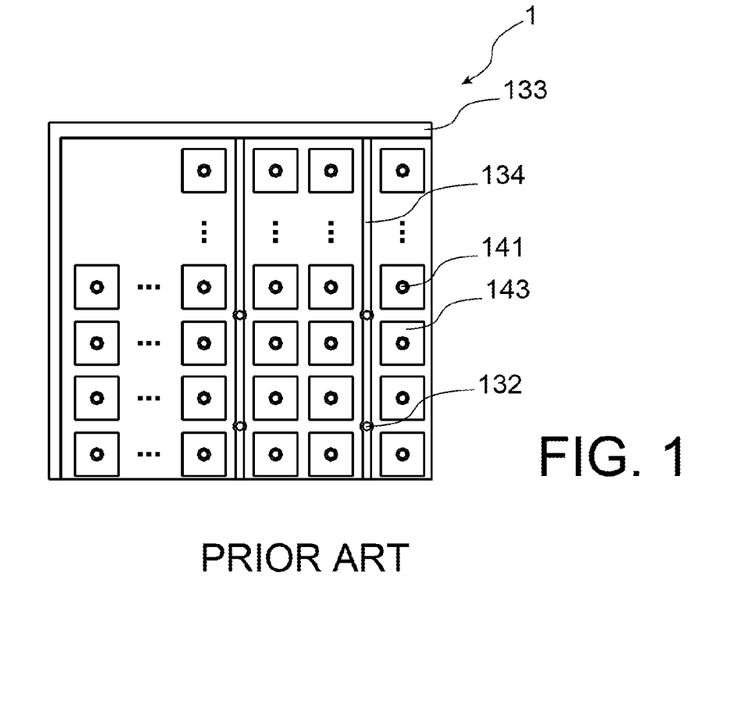
FIG. 1 illustrates an exemplary prior art component wherein the portion of the semi-conducting layer includes close contacts in order to homogenize the bias of the semi-conducting layer, FIG. 2 schematically illustrates a cross-section view of the distribution of the space charge region of a structure of a component as illustrated in FIG. 1.

In order to overcome this problem, it is known to equip the components with a bias network such as illustrated in FIG. 1. An example of such network is illustrated in FIG. 8.11, page 297, of the work "Handbook of Infrared Detection Technologies" by M. Henini and M. Razeghi. A component 1 having such a bias network includes:

- a semi-conducting layer, not represented, of a first type of conductivity wherein are provided the semi-conducting zones, not represented, of a second type of conductivity reverse to the first type of conductivity, the zones being distributed on a portion of the semi-conducting layer,
- a peripheral bias contact 133 adapted to bias the portion of semi-conducting layer on its periphery,
- conducting tracks 134 provided along the portion of the semi-conducting layer, said tracks being in electrical contact with the peripheral bias contact 133,
- close contacts 132 provided along the conducting tracks 134 and adapted to bias the portion of the semi-conducting layer at several locations,
- connecting pads 143 each associated with the semi-conducting zone of one of the structures, each of the pads 143 being in electrical contact with the zone with which it is associated by a conducting via 141.

Thus, the bias contact, conducting tracks and close contacts form a first bias means, whereas each of the connecting pads with the corresponding conducting via forms a second bias means.

A component having such a bias network allows a homogeneous and individual bias of each of the structures regardless of the semi-conductor material wherein the semi-conducting layer is formed.

However, if with such a configuration of the bias network, the bias of the semi-conducting layer is homogeneous, such a configuration has the drawback that each of the structures is subjected, in use, to a different electromagnetic environment from that of the other structures, resulting from an inhomogeneous behaviour of the structures in use. Indeed, the conducting tracks, by extending along the portion of the semi-conducting layer, act as gates and modify the charge distribution in the semi-conducting layer and in particular at the semi-conducting zones. As a result, the operation of the structures is affected.

Figure 2:
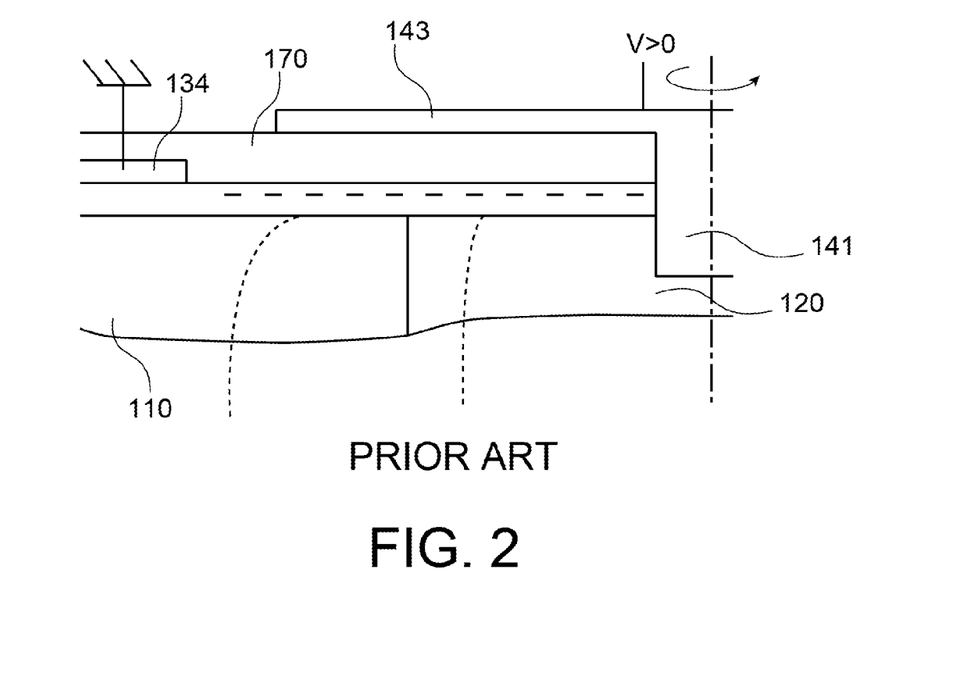

The operation of the structures is also affected, as illustrated in FIG. 2, by a modification in the distribution in the space charge region in use. Indeed, the potential difference between the connecting pads 143 and the semi-conducting layer 110 of the first type of conductivity causes a charging of the insulator 170 which passivates the structure 10 and which insulates the connecting pads 143 from the surface of the semi-conducting layer 110. This charging of the insulator 170 modifies, as illustrated in FIG. 2, the distribution of the space charge region (in dashed lines in FIG. 2) at the surface of the semi-conducting layer 110. As a result at the surface, there is a "pinching" of the space charge region and thus a reduction, at the surface, of the potential barrier present between the semi-conducting layer and each of the semi-conducting zones 120 with the effect that the leakage current increases in each of the structures.

Moreover, in the case where the structures are structures intended to receive an electromagnetic radiation, the contact pads and the conducting tracks also act as reflectors to reflect the part of the electromagnetic radiation that is received by the structures and which is not absorbed by the latter, such that this part of radiation is sent back into the structures to be absorbed therein. With such a configuration, the spaces between the conducting tracks and the contact pads are not covered by a system of reflectors and the significant part of the radiation which passes through these spaces is not sent back into the structures and thus does not contribute to the signal. Such a drawback also exists in the case where the structures are structures intended to emit an electromagnetic radiation, in which the part of the electromagnetic radiation not emitted to the emitting face of the structure has to be reflected by the connecting pads and conducting tracks acting as reflectors.

The abovementioned drawbacks relating to the different electromagnetic environments for each of the structures are associated with the use of the conducting tracks and are thus generally inherent to the components including a semi-conducting layer which is not sufficiently conducting to ensure a homogeneous bias of the first poles of each of the structures. As regards the other abovementioned drawbacks, that is the presence of a "pinching" of the charge region increasing the leakage current in each of the structures and the existence of a significant part of the radiation which is not absorbed, or not emitted to the emitting face, these are also present in the components not having such a semi-conducting layer.

Indeed, in the components not having such a semi-conducting layer, such as for example the components including a semi-conducting layer made in a mercury-cadmium telluride $Cd_xHg_{1-x}Te$ having a conductivity of the type wherein the majority carriers are electrons, and which thus do not include conducting tracks, the connecting pads are employed to bias the semi-conducting zones of the structures and to reflect the part of the electromagnetic radiation which is not absorbed as the radiation passes into the structures, or which is not emitted to the emitting face of the structure. As a result, as well as for a component having conducting tracks, the connecting pads cause a charging of the insulator passivating the semi-conducting layer. Because of this charging, such components thus have also in use a "pinching" of the space charge regions of their structures and thus a significant leakage current which adds to the drawbacks that a significant part of the radiation which is not absorbed, or not emitted to the emitting face, by the structures is not reflected because of the spacing between the connecting pads.

DISCLOSURE OF THE INVENTION

The present invention aims at overcoming at least part of the abovementioned drawbacks.

One purpose of the invention is to provide a component including a plurality of semi-conducting structures provided in a semi-conducting layer, each structure having in use a reduced leakage current relative to a structure of a prior art component.

Another purpose of the invention is to provide a component including a plurality of semi-conducting structures provided in a semi-conducting layer, each of the structures being intended to absorb an electromagnetic radiation and being biased by means of a corresponding connecting pad also acting as a reflector, wherein the component can be adapted such that the part of the radiation received by the component and not absorbed by the structures is significantly reduced relative to a prior art component.

Another purpose of the invention is to provide a component including a plurality of semi-conducting structures provided in a semi-conducting layer, each of the structures being intended to emit an electromagnetic radiation and being biased by means of a corresponding connecting pad also acting as a reflector, wherein the component can be adapted such that the part of the radiation emitted by the structures and not transmitted to the emitting face is significantly reduced relative to a prior art component.

Another purpose of the invention is to provide a component including a plurality of semi-conducting structures provided in a semi-conducting layer which forms the first poles of said structures, said semi-conducting layer being not sufficiently conducting to ensure a homogeneous bias of the first poles of each of the structures, the component including a first bias means of the semi-conducting layer which is adapted such that the structures have a substantially identical electromagnetic environment between them.

To that end, the invention relates to a semi-conducting component including:
a semi-conducting support including a first face and at least one semi-conducting layer, of a first type of conductivity, the surface of which forms said first face,
a plurality of optoelectronic semi-conducting structures provided in a portion of the semi-conducting layer, each structure including at least one semi-conducting zone of a second type of conductivity opposite the first type of conductivity,
an electrically insulating layer in contact with the first face of the support and extending at least along the portion of the semi-conducting layer,
a first bias means adapted to bias the semi-conducting layer along the portion of the semi-conducting layer,
second bias means each associated with a semi-conducting structure and each adapted to bias the corresponding semi-conducting zone,
the first bias means comprising a conducting layer in contact with the insulating layer on the face of the insulating layer which is opposite the support and which extends along the portion of the semi-conducting layer, the conducting layer including passageways for each of the second bias means with a spacing between the conducting layer and each of said second bias means which is located facing the corresponding semi-conducting zone.

Herein above and in the remainder of this document, by "a semi-conducting layer having a first type of conductivity", it is intended that most of the semi-conducting layer includes a first type of conductivity, wherein the latter can, on some zones, such as the semi-conducting zones associated with the structures, have another type of conductivity.

The electrically insulating layer is also called an insulating layer.

Such a conducting layer causes, when the structures are in use, a charging of the insulating layer. This charging occurs in the regions of the insulating layer which are both covered by the conducting layer and which cover the locations of the semi-conducting layer the potential of which is modified by the bias of one of the semi-conducting zones. Thus, the spacing between the semi-conducting layer and the corresponding second bias means being positioned for each structure facing the corresponding semi-conducting zone, the charging of the insulating layer influences the distribution of the space charge region at least in its part extending beyond the semi-conducting zone. Thus, the charging generated by the conducting layer inhibits any influence of the corresponding second bias means avoiding the appearance of a "pinching" of the space charge region as observed for prior art components. The structures of such a component, by not having a pinching phenomenon of the space charge region offer, in use, a reduced leakage current relative to structures of a prior art component.

Moreover, with such a configuration of the component and for structures intended to absorb an electromagnetic radiation, the conducting layer and the second bias means can be adapted to reflect the electromagnetic radiation received by the component. According to this possibility, in use, the part of the electromagnetic radiation not absorbed by the structures is reflected by the conducting layer and the second means to be retransmitted to the structures such that it is absorbed therein and it contributes to the signal. The part of the electromagnetic radiation which is not absorbed is that passing through the spacings present between the conducting layer and the second bias means. Since these spacings are positioned each facing the corresponding semi-conducting zone, as a result, for a dimension identical to that of prior art spacings, they occupy a reduced surface with respect to those of prior art components, regardless of whether they have conducting tracks or not. A component according to this possibility thus has a reduced part of the radiation which is not absorbed relative to prior art structures. This is also transposable in the case where the structures are intended to emit an electromagnetic radiation, wherein a reduced part of the electromagnetic radiation emitted is not transmitted to the emitting face of the component.

Finally, it can be noticed that with such a component, the bias of the semi-conducting layer can be readily achieved by means of close contacts electrically connected to the conducting layer without significant electromagnetic environment difference between the structures. Indeed, with such a component, the electromagnetic environment of each structure is mainly related to the conducting layer and the contact pad without being affected by any conducting track. Each structure is thus, for an identical bias of each of them, subjected to the same electromagnetic environment without being significantly affected by a possible close contact. As a result, there is a response to a given electromagnetic radiation which is more homogeneous for all the structures of the component with respect to the structures of a prior art component including conducting tracks to contact the close contacts.

At least one part, preferably all the structures are structures intended to absorb an electromagnetic radiation and to transform it into an electrical signal.

The conducting layer can cover at least partly each of said semi-conducting zones.

The part of each of the semi-conducting zones which is covered by the conducting layer can comprise the part of the space charge region, formed between said semi-conducting zone and the semi-conducting layer, which is located in the semi-conducting zone.

The part of the above space charge region is of course meant as the part representing all the part of the space charge region located in the semi-conducting zone.

Each of the semi-conducting zones can include a concentration of majority carriers at least 10 times higher than that of the semi-conducting layer, and the conducting layer can cover a part of each of the semi-conducting zones which extends from the semi-conducting layer on a dimension of at least 0.1 µm, preferentially at least 0.2 µm and particularly advantageously at least 0.5 µm.

The dimensions of the passageway of each of the second bias means can be adapted such that a part of the semi-conducting zone of the corresponding structure is covered by the conducting zone, the external perimeter of said semi-conducting zone being covered with the conducting layer.

In this manner, the conducting layer enables, when the structures are in use, the charging of the insulating layer to be modified and thus the distribution of each space charge region to be modified in the corresponding semi-conducting zone. As a result, there is an increased width of the space charge region in proximity of the insulating layer and thus of the potential barrier related thereto. The leakage current of each of the structures is thereby restricted with respect to a prior art structure which does not have such a widening of the space charge region.

The first bias means is adapted to bias the portion of the semi-conducting layer at several locations.

Such a component, whether it includes or not a semi-conducting layer conducting enough to ensure that the bias of the first poles of each of the structures is homogeneous, has a bias of the first poles of each of the structures which is homogeneous. Indeed, such an adaptation enables, by biasing the semi-conducting layer at several locations, the distance over which the semi-conducting layer is able to be unbiased to be restricted.

Such a possibility is particularly adapted in the case where the semi-conducting layer is not conducting enough to ensure that the bias of the first poles of each of the structures is homogeneous.

Of course, the first means can also be adapted to bias the semi-conducting layer at a single location, as the perimeter of the portion of the semi-conducting layer.

This possibility is adapted in the case where the component includes a semi-conducting layer having a good conductivity and which thus does not have an unbias along said portion.

Since the structures are intended to operate in a given wavelength range, the conducting layer can be made of a material at least partially reflecting in the given wavelength range.

The conducting layer can be reflecting in the given wavelength range.

A conducting layer made of such a reflecting material enables the optoelectronic semi-conducting structures of the component to be efficiently improved. Indeed, in the case where the structures are structures intended to emit light, this conducting layer allows to reflect towards the substrate the light which would not have been emitted towards the substrate, ensuring that the entire light emitted by the junction be, directly or after reflecting on the conducting layer, towards the substrate. Likewise, if the structures are structures intended to pick up an electromagnetic signal, the electromagnetic radiation received by the substrate and passing through the structure, when it is not absorbed upon passing in the latter, is reflected by the conducting surface and redirected to the structure ensuring that part of the electromagnetic radiation not absorbed by the structure during the first passage is absorbed during this second passage.

The first means can include a plurality of conducting paths between the conducting layer and the semi-conducting layer, said paths being arranged along the portion of the conducting layer to bias the semi-conducting layer in several locations of the portion of the semi-conducting layer.

Such conducting paths enable the semi-conducting layer to be locally biased along its portion thus restricting the unbiased risks of the latter which could exist when the component has only one peripheral bias contact.

Each of the second bias means can include a conducting via passing through the corresponding passageway of the conducting layer and is in electrical contact with the semi-conducting zone of the structure which is associated with said second bias means, each of said conducting vias being electrically separated from the conducting layer by an insulating space which forms the spacing.

Such conducting vias each enable a semi-conducting zone of a structure to be biased through the semi-conducting layer.

Each of the second bias means can further include a conducting zone in the same plane as the conducting layer, said conducting zone being in electrical contact with the conducting via and being electrically separated from the conducting layer by the insulating space.

Thus, the dimension of the passageway corresponding to said second means thus corresponds to the insulating space and to the conducting zone of said second means. Such a conducting zone enables, by a suitable arrangement of the latter to the semi-conducting zone of the structure with which the conducting zone is associated, the electromagnetic environment to be controlled when said structure is in use. Thus, it is possible, with a suitable arrangement of this zone to increase the size of the space charge region of the structure. The efficiency and reliability of the structure are thus improved.

Since the structures are intended to operate in a given wavelength range, the conducting zone can be made of a material at least partially reflecting in the given wavelength range, preferentially reflecting in the given wavelength range.

Such a conducting zone enables, by reflecting the electromagnetic radiation which is emitted, in the case of light emitting structures, or received, in the case of light sensor type structures, the efficiency of the structure with which it is associated to be increased, in the same way as the conducting layer when the latter is also reflecting.

Each of the passageways of one of the second bias means can consist of the conducting via, the conducting zone and the insulating space corresponding to this second bias means.

Each of the structures can be a photodiode adapted to operate in the infrared wavelength range and preferentially in a wavelength range selected from the group including the near infrared, medium infrared and far infrared wavelength range.

Such structures are particularly able to benefit from improvements provided by the invention, the semi-conducting layer wherein they are provided being generally a small gap semi-conductor particularly affected in the absence of local contacts by a partial unbias.

The semi-conducting layer can be made of a semi-conductor material the energy band gap of which is lower than 1.5 eV, the semi-conductor material being preferentially $Cd_xHg_{1-x}Te$ type mercury-cadmium telluride with x between 1 and 0.

A component including such a semi-conducting layer is particularly able to benefit from the advantages of the invention, especially when using a single peripheral contact is not sufficient but requires biasing the semi-conducting layer in several locations. Thus, without the benefit of the invention, the structures of such a component do not have a homogeneous behaviour between them because they are subjected to different electromagnetic environments related to the presence of the conducting tracks.

The component can be adapted to be coupled with a control device, each of the second bias means including a connecting pad adapted to be connected to a contact of the control device, this connection being preferentially achieved by indium ball hybridization.

The invention also relates to a method for manufacturing a semi-conducting component comprising the steps of:
    providing a semi-conducting support having a first face, said first face comprising at least one semi-conducting layer of a first type of conductivity,
    forming an electrically insulating layer in contact with the first face of the support and extending at least along a portion of the semi-conducting layer,
    providing a plurality of semi-conducting zones of a second type of conductivity opposite the first type of conductivity in the semi-conducting layer, so as to form a plurality of optoelectronic semi-conducting structures each including one of the semi-conducting zones,
    forming in the insulating layer holes each in communication with a semi-conducting zone,
    forming a conducting layer, the conducting material forming the conducting layer also filling said holes,
    forming in the conducting layer insulating spaces arranged to insulate conducting zones from the rest of the conducting layer, said conducting zones being each in contact with a hole so as to form with the conducting material filling the hole a second bias means adapted to bias the corresponding semi-conducting zone, the rest of the conducting layer forming a first bias means adapted to bias the semi-conducting layer, each conducting zone forming with the insulating space, which electrically insulates it from the rest of the conducting zone, a passageway in the rest of the conducting layer.

The rest of the conducting layer can cover at least partly each of the semi-conducting zones.

Such a method allows to provide a component the structures of which have a behaviour in use which is substantially homogeneous, since their operation is not affected by electromagnetic environments which would be different for each of the electromagnetic structures.

The manufacturing method can further include, before the step of forming the conducting layer, a step of forming holes each in communication with a location of the portion of the semi-conducting layer, said holes being intended to form during the step of forming the conducting layer and filling them with the conducting material, conducting paths adapted to bias the semi-conducting layer at said locations.

Such a forming method allows to form a component particularly adapted in the case where the semi-conducting layer is not conducting enough to provide a homogeneous bias of the first poles of the structures, wherein the bias of the semi-conducting layer can occur in several locations.

BRIEF DESCRIPTION OF DRAWINGS

The present invention will be better understood upon reading the description of exemplary embodiments, given merely as an indication and in no way limiting, making reference to the appended drawings wherein:

FIGS. 6a to 6l illustrate the different steps of manufacturing a component according to the first embodiment of the invention.

Identical, similar or equivalent parts of the different figures bear the same reference numerals so as to facilitate switching from one figure to another.

The different parts represented in the figures are not necessarily drawn at a uniform scale, for the figures to be more legible.

Different possibilities (alternatives and embodiments) should be understood as being not excluding from each other and can be combined between them.

DETAILED DISCLOSURE OF PARTICULAR EMBODIMENTS

Figure 3:
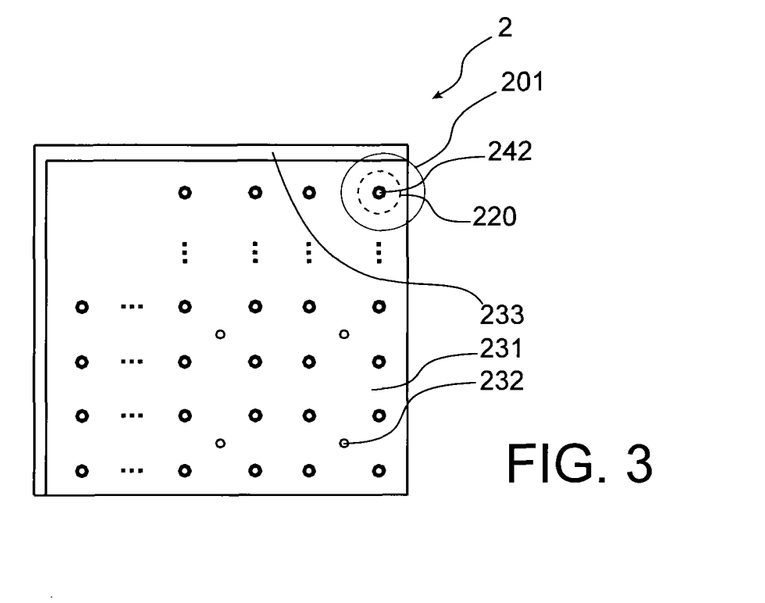
FIG. 3 illustrates a top view of a component according to a first embodiment of the invention.
Figure 4:
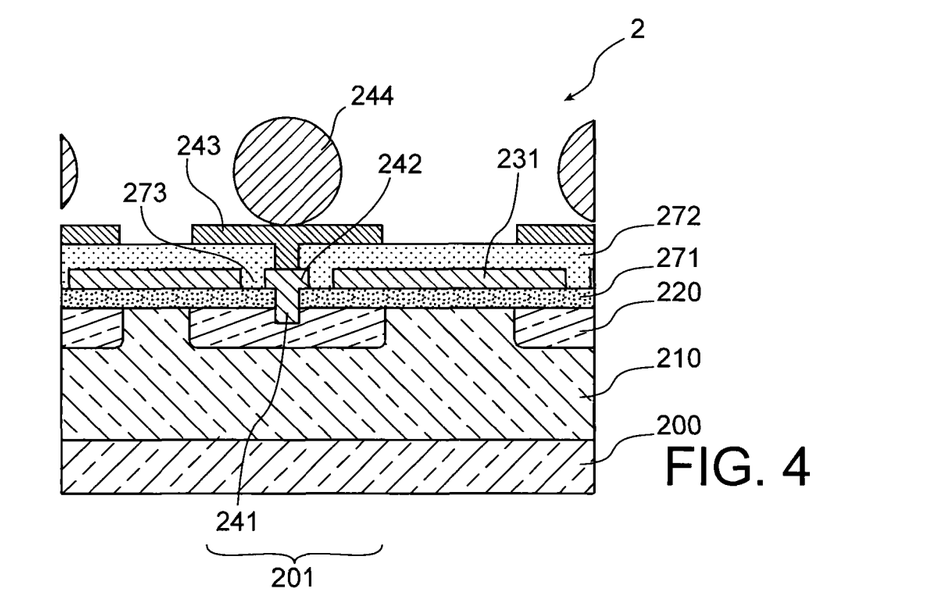
FIG. 4 illustrates a transverse cross-section view of a component according to the first embodiment of the invention, FIG. 5 respectively illustrate, for the top view and the bottom view, a transverse cross-section view and a top view of a structure provided in a component according to the first embodiment of the invention.

FIGS. 3 and 4 illustrate a component 2 according to the invention which includes a plurality of optoelectronic semi-conducting structures 201.

The embodiment of the invention which is illustrated in FIGS. 3 to 6, is a particular embodiment of the invention wherein the structures 201 are structures, such as photodiodes, adapted to pick up an electromagnetic radiation in a wavelength range included in the infrared.

This embodiment, called a particular application in the remainder of this document, is only an example of application of the invention which relates both to the components including optoelectronic semi-conducting structures suitable for emitting an electromagnetic radiation and the components including electromagnetic radiation sensor type optoelectronic semi-conducting structures, said structures being adapted to operate in any wavelength range, such as visible or near infrared wavelength ranges.

A component 2 according to the invention includes, as illustrated in FIGS. 3 and 4:
- a semi-conducting support 200, 210 including a first face and at least one semi-conducting layer 210, of a first type of conductivity, the surface of which forms said first face,
- a plurality of optoelectronic semi-conducting structures 201 provided in a portion of the semi-conducting layer 210, each structure 201 including at least one semi-conducting zone 220 of a second type of conductivity opposite the first type of conductivity,
- a first insulating layer 271 made of an electrically insulating material and in contact with the first face of the support 200, said first insulating layer 271 extending at least on the portion of the semi-conducting layer 210,
- a peripheral contact 233 in electrical contact through the first insulating layer 271 with the semi-conducting layer 210,
- a conducting layer 231 wherein passageways are provided, said conducting layer 231 further having conducting paths arranged in the component so as to put the conducting layer 231 and the semi-conducting layer 210 in electrical contact in several locations of the portion of the semi-conducting layer,
- conducting zones 242 each associated with a structure 201, each conducting zone 242 being in the same plane as the conducting layer 231 and being electrically separated from the conducting layer 231 by a space 273,
- conducting vias 241 each associated with a structure 201, each conducting via 241 connecting a conducting zone 242 to a corresponding semi-conducting zone 220,
- a second insulating layer 272 of an electrically insulating material which, being in contact with the conducting layer 231, extends along the portion of the semi-conducting layer 210,
- connecting pads 243 provided on the second insulating layer 272, each being in contact with a conducting zone 242 and being adapted to make an electrical contact, for example by indium ball hybridization 244, with a connecting pad of a control device (not represented).

The semi-conducting support 200, 210 is a support conventionally used for optoelectronics applications, the component including a substrate 200 being transparent in the wavelength range in which the structures 201 are intended to operate. The substrate 200 is made of a semi-conductor material conventionally used for optoelectronics applications, such as for example silicon, silicon carbide, sapphire.

The semi-conducting support 200, 210 is a substantially planar support.

In the particular application of the invention, the semi-conducting substrate 200 is a substrate of zinc cadmium telluride (CdZnTe) which is transparent in the infrared wavelength range.

The semi-conducting layer 210 is a semi-conducting layer adapted for optoelectronics applications. The semi-conducting layer 210 is made of a direct gap semi-conductor material such as gallium arsenide (GaAs) and indium phosphide (InP). The semi-conducting layer has on its major part a first type of conductivity selected from the group including the type of conductivity the majority carriers of which are electrons and the type of conductivity the majority carriers of which are holes.

By direct gap semi-conductor material, it is meant a semi-conductor material the energy maximum of the valence band and the energy minimum of the conduction band of which are located at a value of the wave vector k substantially in the energy scatter diagram of said semi-conductor material.

In the particular application, the semi-conducting layer is a layer of $Cd_xHg_{1-x}Te$ type mercury-cadmium telluride with x between 0 and 1. The value of the proportion of cadmium X is selected as a function of the wavelength range in which the structures are intended to operate. Thus, for structures adapted to receive an electromagnetic radiation in the medium infrared range lower than 3 µm, a proportion of cadmium X can be 0.4, and for the medium infrared range lower than 5 µm, the proportion of cadmium X is 0.3. For structures 201 adapted to receive an electromagnetic radiation in the far infrared range lower than 10 µm, the proportion of cadmium X is 0.22.

In the particular application, the type of conductivity of the semi-conducting layer 210 is a type of conductivity the majority carriers of which are holes. Likewise, the concentration of majority carriers of the semi-conducting layer is between $10^{14}$ and $10^{18}$ $cm^{-3}$ in the particular application.

The semi-conducting zone 220 of each of the structures 201 is a zone of the semi-conducting layer 210 the type of conductivity of which is reverse from the rest of the semi-conducting layer 220. Thus, each semi-conducting zone 220 forms, together with the major part of the semi-conducting layer 201, a semi-conducting junction adapted for optoelectronics applications.

The conductivity of each of the semi-conducting zones 220 is, for a major part of the semi-conducting layer 210 which is of the type of conductivity the majority carriers of which are electrons, of the type the majority carriers of which are holes. For a major part of the semi-conducting layer 210 the conductivity of which is of the type the majority carriers of which are holes, the conductivity of the semi-conducting zones 220 is of the type the majority carriers of which are electrons.

Each semi-conducting zone 220 occupies a volume of the semi-conducting layer 210 by preferentially extending from the first face of the semi-conducting support. The shape of the zone can be a cube, parallelepiped, cylinder or else. Each semi-conducting zone 220 can extend in depth from the first face of the support on all or part of the thickness of the semi-conducting layer 210.

Figure 5:
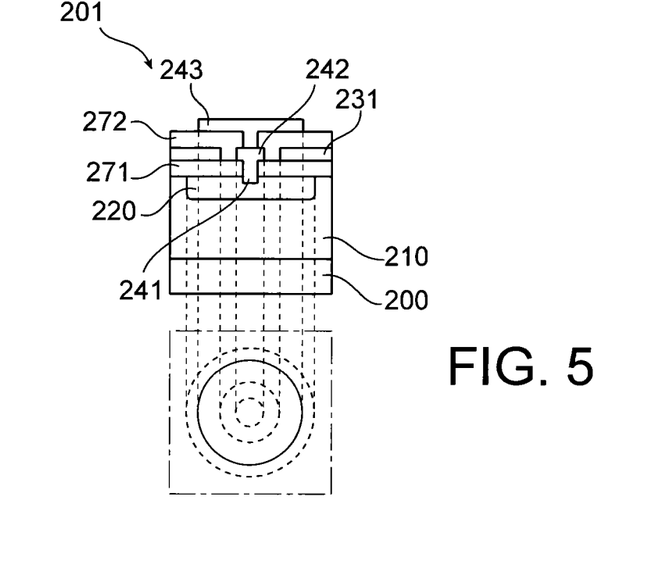

In the particular application, each of the semi-conducting zones 220 has a conductivity of the type the majority carriers of which are electrons. Each semi-conducting zone 220 has, as illustrated in FIG. 5, a substantially cylindrical shape which extends from the first face on a quarter thickness of the semi-conducting layer 210. The concentration of majority carriers of each semi-conducting zone 220 is, in the particular application, between $10^{14}$ and $10^{18}$ cm$^{-3}$.

Advantageously, each of the semi-conducting zones 220 has a concentration of majority carriers at least ten times higher than that of the semi-conducting layer 210.

Each of the semi-conducting zones 220 and the fraction of the semi-conducting layer 210 with which said semi-conducting zone 220 is in contact, form an optoelectronic structure 201 which is adapted either to emit an electromagnetic radiation, or to receive an electromagnetic radiation. According to this configuration, each fraction of the semi-conducting layer 210 forms the first pole of the corresponding structure 201, the corresponding semi-conducting zone 220 forming the second pole of this same structure 201.

In the particular application, the semi-conducting zone 220 and the fraction of the semi-conducting layer with which the semi-conducting zone 220 is in contact form an optoelectronic structure 201 adapted to receive an electromagnetic radiation, that is of the sensor type.

In the particular application, as is the case in the major part of the embodiments of the invention, the structures 201 are provided in the semi-conducting layer 210 as an array of structures 201. Thus, the structures 201 arranged as columns and rows enable the surface of a portion of the semi-conducting layer 210 to be orderly covered readily enabling each of the structures 201 to be individually addressed.

The first insulating layer 271 is in contact with the first face of the semi-conducting layer 210 and extends along the semi-conducting layer 210 on the portion of the semi-conducting layer 210 in which the structures 201 are provided. It is made of an electrically insulating material, such as silicon dioxide SiO$_2$, cadmium telluride CdTe or zinc sulphide ZnS.

The thickness of the first insulating layer 271 is adapted to insulate the semi-conducting layer 210 from the conducting layer 231.

In the particular application, the electrically insulating material is selected from the group including silicon dioxide (SiO$_2$), cadmium telluride (CdTe) and zinc sulphide (ZnS), or any other material having a high dielectric constant, also known as High-K.

The insulating layer 271 can have a thickness of a few hundred manometers.

The peripheral contact 233, the conducting paths 232 and the conducting vias 241 are provided in the insulating layer 271. The peripheral contact 233 and the conducting paths 233 are adapted to communicate the conducting layer 231 with the major part of the semi-conducting layer 210 at the periphery of the portion of the semi-conducting layer 210 and in locations of the semi-conducting layer 210 respectively. The conducting vias 241 are arranged in the first insulating layer 271, along the semi-conducting layer 210, so as to connect each of them to a structure 201 with which they are associated and a conducting zone 242 corresponding to said semi-conducting structure 201.

The conducting layer 231 is in contact with the first insulating layer 271 on the face of the first insulating layer 271 which is opposite the semi-conducting layer 220. The conducting layer 231 extends substantially at the portion of the semi-conducting layer 220. The conducting layer 231 is made of a conducting material. The conducting layer 231 is preferentially made of a material adapted to reflect at least partially an electromagnetic radiation the wavelength range of which is in the wavelength range wherein the structures 201 are adapted to operate. The conducting material can be, for example, gold (Au). The conducting layer has preferentially a thickness of a few hundred manometers.

In the particular application, the conducting layer is made of gold (Au).

The conducting layer 231 includes passageways each adapted for placing a conducting zone 242 which is associated with a structure 201 and for the presence of an insulating space 273 between said conducting zone 242 and the conducting layer 231. Thus, each passageway is adapted for the passage of one of the second bias means including the corresponding conducting zone 231.

The conducting layer 231 forms with the peripheral contact 233 and the conducting paths 232 a first bias means adapted to bias the semi-conducting layer 220 in several locations.

Each of the conducting zones 242 is a zone of a substantially planar conducting material which covers the conducting via 241 corresponding to the structure 201 with which said conducting zone 242 is associated. Each conducting zone 242 extends substantially in the same plane as the conducting layer 231. Each conducting zone 242 is made of a conducting material. Each conducting zone 242 is preferentially made of a material adapted to reflect at least partially an electromagnetic radiation the wavelength of which is in the wavelength range wherein the structures 201 are adapted to operate. The conducting material may be gold (Au). The conducting zone has preferentially a thickness of a few hundred manometers.

The conducting layer 231 and the conducting zones 242 are preferentially made of the same conducting material.

Each conducting zone 242, with the insulating space 273, is dimensioned such that the insulating space 273 be facing the semi-conducting zone 220.

Each conducting zone 242, with the insulating space 273, is preferentially dimensioned, as illustrated in FIG. 5, such that part of the semi-conducting zone 220 of the corresponding structure 201 is covered by the conducting layer 231, the external perimeter of said semi-conducting zone 220 being covered with the conducting layer 231. With such a possibility, the concentration in each of the semi-conducting zones 220 of carriers of each type is influenced in use by the bias of the conducting layer 231.

Advantageously, the conducting layer 231 is arranged to cover part of each of the semi-conducting zones 220 which comprises the part of the space charge region, formed between said semi-conducting zone 220 and the semi-conducting layer 210, which is located in the semi-conducting zone 220.

With semi-conducting zones including a concentration of majority carriers at least 10 times higher than that of the semi-conducting layer, the space charge region extends mainly in the semi-conducting layer and extends over a distance higher than 0.2 µm or even 0.1 µm. Thus, such a covering of the space charge region formed between each of the semi-conducting zones and the semi-conducting layer 210 can be provided by a conducting layer 231 which covers the part of each of the semi-conducting zones 220 which extends from the semi-conducting layer 210 on a dimension of at least 0.1 µm, preferentially 0.2 µm and particularly advantageously 0.5 µm.

The second insulating layer 272 is in contact with the conducting layer 231 on the face of the conducting layer 231 which is opposite the first insulating layer 271. The second insulating layer 272 extends along the conducting layer 231 substantially at the portion of the semi-conducting layer 210 wherein the structures 201 are provided. The second insulating layer 272 is made of an electrically insulating material, such as silicon dioxide ($SiO_2$), cadmium telluride (CdTe), zinc sulphide (ZnS) or any other material having a high dielectric constant.

The electrically insulating material of which is made the second insulating layer also fills the insulating space 273.

The thickness of the second insulating layer 272 is adapted to insulate the conducting layer 231 from the connecting pads 243.

In the particular application, the electrically insulating material forming the second insulating layer is selected from the group including silicon dioxide ($SiO_2$), cadmium telluride (CdTe) and zinc sulphide (ZnS).

Bonding zones are provided in the second insulating layer 272, and these bonding zones are arranged each to connect a connecting pad 243 with the conducting zone 242 corresponding to the structure 201 with which the connecting pad 243 is associated.

The connecting pads 243 are adapted to allow a connection with a control device by indium ball hybridization 244. Other hybridization types are however possible.

The assembly formed by the conducting via 241, the conducting zone 242 and the connecting pad 243 associated with a same semi-conducting structure 201, forms a second bias means of said structure 201 adapted to bias the semi-conducting zone 220 of said structure 201.

FIGS. 6a to 6l illustrate the different steps of a method for manufacturing a component 2 according to the invention.

Figure 6A:
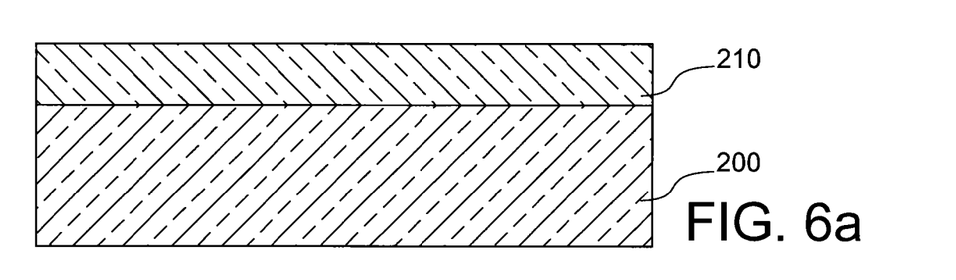
Figure 6B:
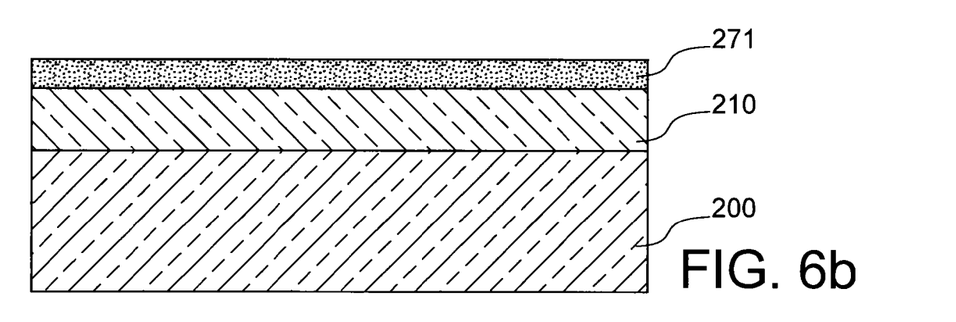
Figure 6C:
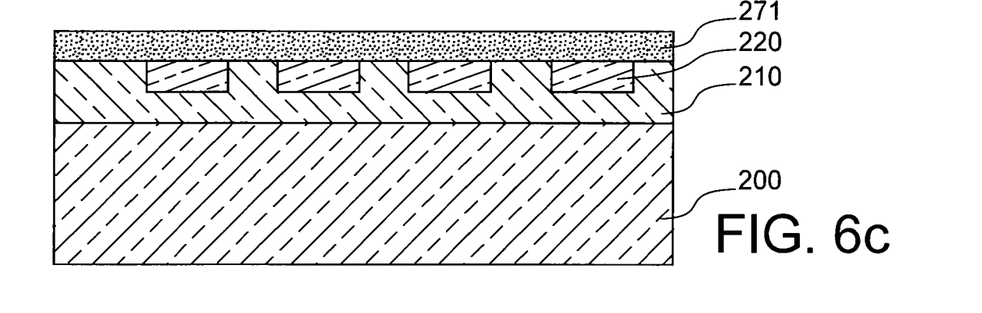
Figure 6D:
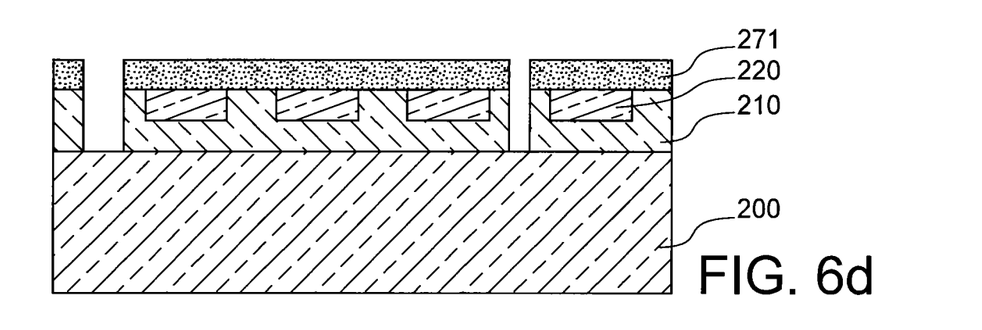
Figure 6E:
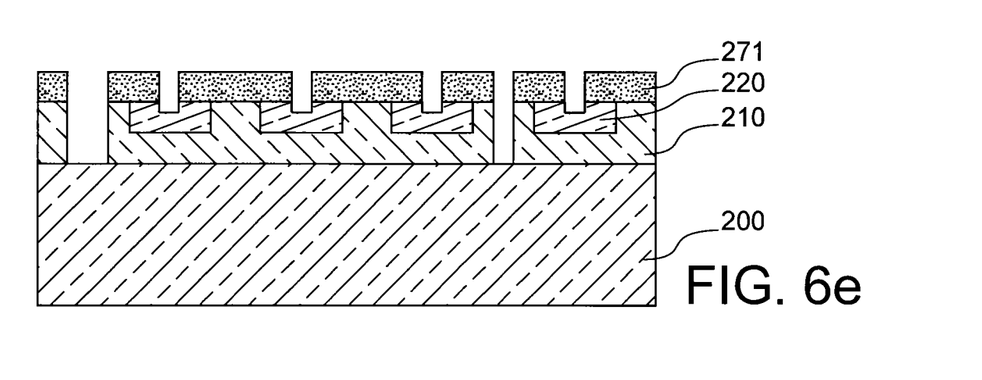
Figure 6F:
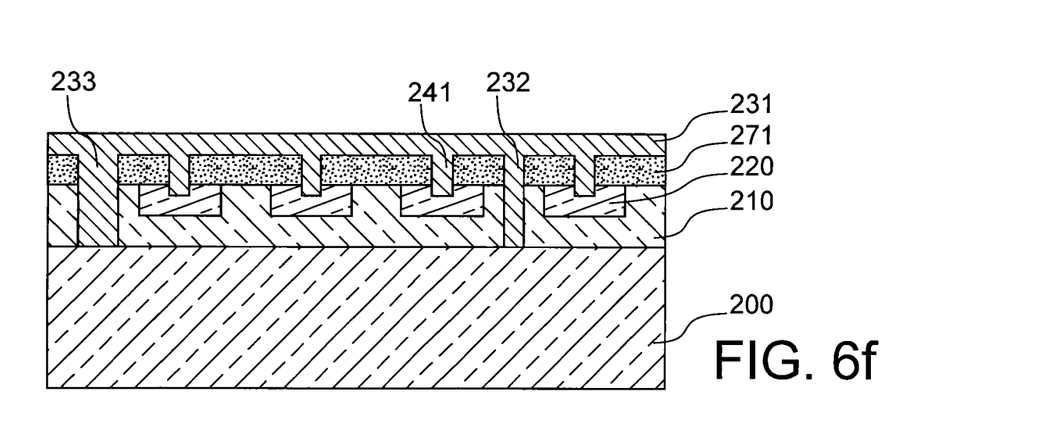
Figure 6G:
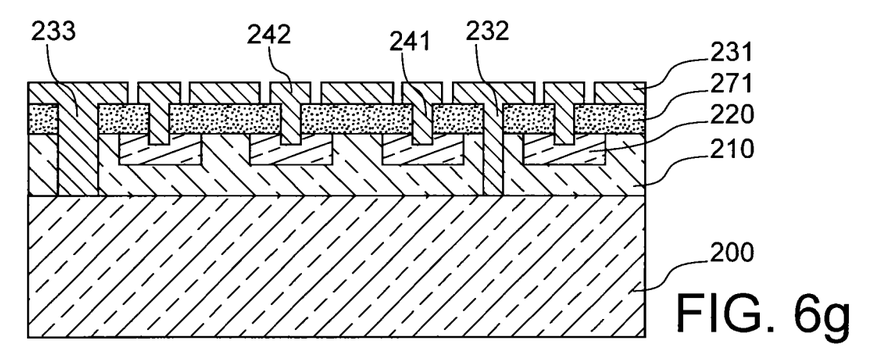
Figure 6H:
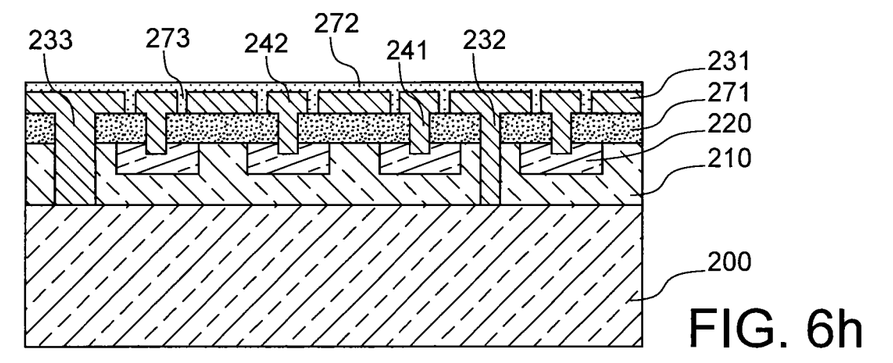
Figure 6I:
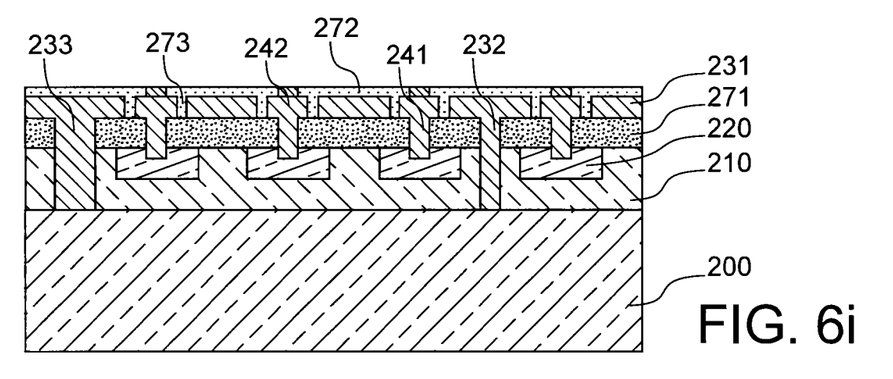
Figure 6J:
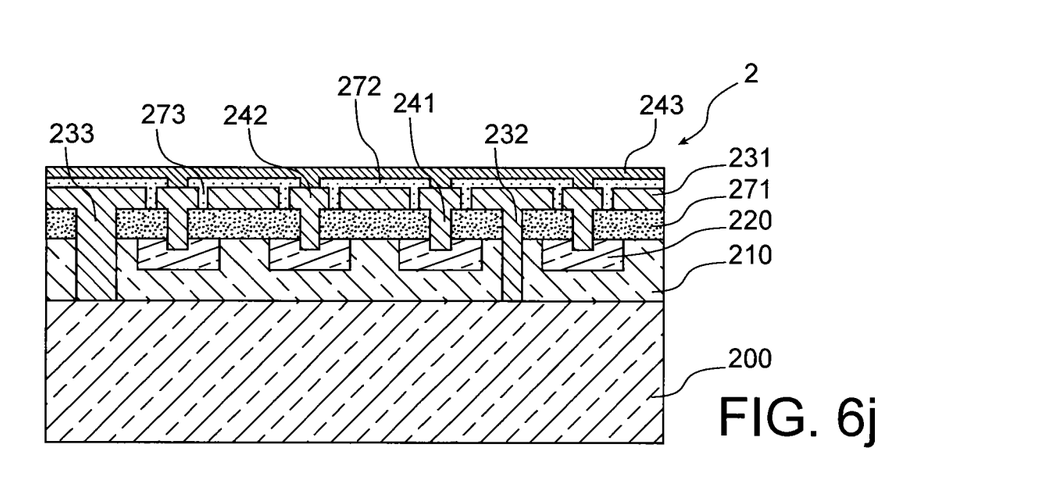
Figure 6K:
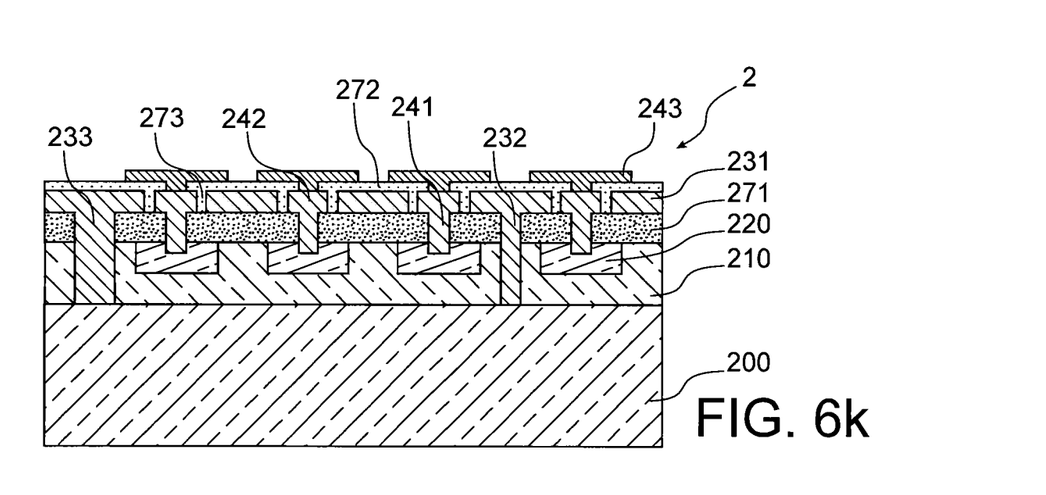

Such a method comprises the steps of:

providing, as illustrated in FIG. 6a, the support having a first face, said first face comprising at least the semi-conducting layer 210 of a first type of conductivity, forming, as illustrated in FIG. 6b, the first insulating layer 271 made in an electrically insulating material, the first insulating layer 271 being in contact with the first face of the support and extending at least along a portion of the semi-conducting layer 210, providing, as illustrated in FIG. 6c, the plurality of semi-conducting zones 220 of a second type of conductivity opposite the first type of conductivity in the semi-conducting layer 210, so as to form a plurality of optoelectronic structures 201 each including one of the semi-conducting zones 220, forming, as illustrated in FIG. 6d, in the first insulating layer 272, first holes each in communication with a location of the portion of the semi-conducting layer 210, one part of these first holes being intended to form the peripheral contact 233, the other part of these holes being intended to form the conducting paths 232, forming, as illustrated in FIG. 6e, in the first insulating layer 271, second holes each in communication with a semi-conducting zone 220, these second holes being intended to form conducting vias 241, forming, as illustrated in FIG. 6f, the conducting layer 231, the conducting material forming the conducting layer 231 also filling the first and second holes so as to form the peripheral contact 233, the conducting paths 232 and the conducting vias 241, forming, as illustrated in FIG. 6g, in the conducting layer 231 the insulating spaces 273 arranged to insulate the conducting zones 242 from the rest of the conducting layer 231, the conducting zones 242 being each in contact with a conducting via 241, forming, as illustrated in FIG. 6h, the second insulating layer 272 in contact with the conducting layer 231, the material forming the second insulating layer 272 filling the insulating spaces 273 thus ensuring a better electrical insulation between the conducting zones 242 and the conducting layer 231, provided, as illustrated in FIG. 6i, bonding zones in the second insulating layer 272, said bonding zones forming apertures of the insulating layer each in communication with a conducting zone 242, depositing, as illustrated in FIG. 6j, a second conducting layer made of a conducting material compatible with indium ball hybridization 244, the conducting material filling the bonding zones so as to electrically connect the second conducting layer with each of the conducting zones 242, forming, as illustrated in FIG. 6k, the connecting pads 243 in the second conducting layer, preparing, as illustrated in FIG. 6l, the connection of the component thus obtained for the connection thereof to a control device of the component, by depositing an indium ball on each of the connecting pads 244.

Such a component manufactured by means of such a manufacturing method is able to be electrically connected to a control device. Such a control device, not illustrated, is generally an electronic component made in a silicon semi-conducting support. The device is adapted to individually control each of the structures 201 and process signals from these structures 201. Such devices being already known, they are not further described in detail in this document.

The manufacturing method described above is particularly adapted to the manufacture of a component according to the particular application of the invention. Of course, the invention is not limited only to components likely to be obtained by such a manufacturing method but encompasses all the components according to the invention, regardless of the manufacturing method that allowed their manufacture.

Likewise, some steps can be performed simultaneously or in a different order without departing from the scope of the invention. Thus, for example, the step of providing semi-conducting zones 220 in the semi-conducting layer can be performed prior to forming the first insulating layer 271, without departing from the scope of the invention.

All the semi-conducting structures 201 according to the invention have, in use, an electromagnetic environment which is identical. As a result, the distribution of equipotentials 301, 302, 303, 304 in each of the structures is identical ensuring an operation, for a given bias, substantially identical for all the semi-conducting structures 201.

Figure 7:
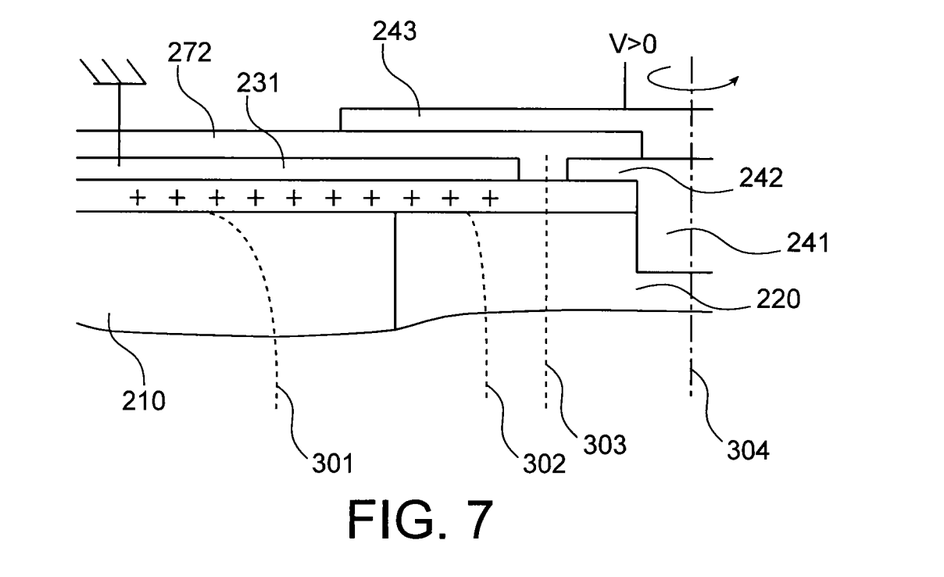
FIG. 7 illustrates the distribution in the electrical field in a structure in use of a component according to the first embodiment of the invention.

FIG. 7 illustrates an example of distribution of the equipotentials 301, 302, 303, 304 along a transverse cross-section of a structure 201 according to the particular application of the invention when the latter structure 201 is in use. In this configuration, the conducting layer 231 is grounded whereas the connecting pad 243 is positively biased.

The potential difference between the connecting pad 244 and the conducting layer 241 induces a potential distribution along the structure 201, as illustrated in FIG. 7, with the creation of a space charge region present between the equipotentials 301 and 302.

Such a potential distribution along the structure 201 creates in the second insulating layer 271, because of the potential difference between the semi-conducting layer 210 and the conducting layer 231, a charge build-up. This charge build-up in the insulator modifies in turn the distribution of the equipotentials 301, 302, 303, 304 in the semi-conducting layer. Such a modification, illustrated in FIG. 7, generates a pronounced curvature at the equipotential 301 and thus a widening of the space charge region in proximity of the surface of the semi-conducting layer 210.

With a configuration according to the particular application and with a concentration of majority carriers of each of the semi-conducting zones 220 which is at least 10 times higher than that of the semi-conducting layer 210, the width of the space charge region of a structure is typically between 0.2 and 2 µm with less than 10% of the space charge region which extends in the corresponding semi-conducting zone 220. With a conducting layer 231 covering a part of the semi-conducting zone 220 extending from the semi-conducting layer 210 on a dimension of at least 0.1 µm, or even at least 0.2 µm and preferentially 0.5 µm, the conducting layer covers the part of the space charge region locating in the semi-conducting zone 220.

Thus, in this configuration, the space charge region widened in proximity of the surface of the semi-conducting layer 210 reduces the leakage current by tunnel effect which passes through the structure 201. With such a distribution in the equipotentials 301, 302, 303, 304, such a semi-conducting structure 201 has both increased sensitivity and reliability.

Another advantage of the invention is that the reflecting surface provided by the assembly formed by the conducting layer 231 and the conducting zones 242 is, unlike prior art illustrated in FIG. 1, in low dependence on the dimension of the insulating space provided between each conducting zone 242 and the conducting layer 231. Thus, with respect to a prior art structure, when the dimensions of the insulating space switch from a thickness of 500 nm to 2 µm for a distance between structures of 30 µm, the reflecting surface has a reduction of only 3% compared to nearly 10% for a prior art component.

Figure 8:
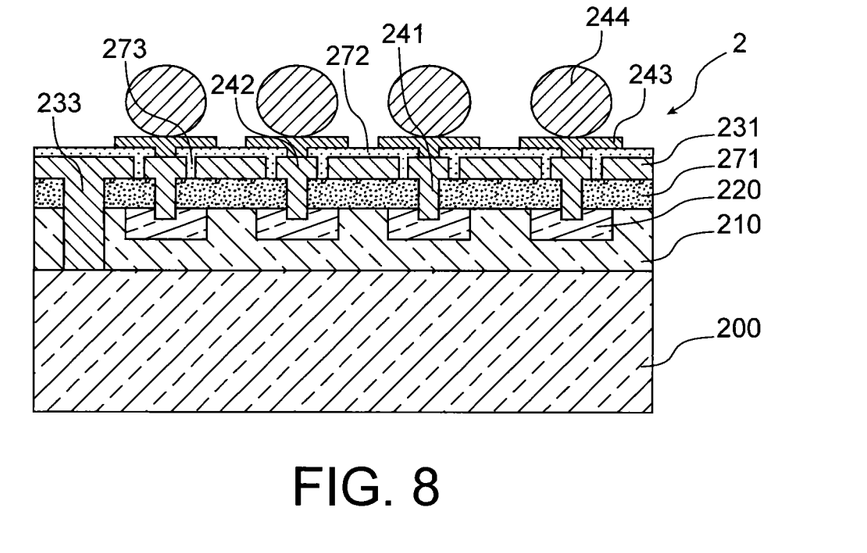
FIG. 8 illustrates a transverse cross-section view of a component according to a second embodiment of the invention.

FIG. 8 illustrates a cross-section view of a component 2 according to a second embodiment. Such a component 2 differs from a component 2 according to the first embodiment in that the portion of the semi-conducting layer 210 is only biased in a single location 233, the perimeter of the portion of the semi-conducting layer 210, and thus in that the component does not include a conducting path such as those referenced 232 in the component 2 according to the first embodiment.

In this embodiment, the semi-conducting layer 210 is conducting enough to bias each first pole of each of the structures 201, and thus has a concentration or mobility of majority carriers which is enough to bias said first poles homogeneously.

A component 2 according to this embodiment can be adapted in accordance with the particular application described in the first embodiment. Thus, a component 2 according to the particular application of the second embodiment differs from a component 2 according to the particular application of the first embodiment in that the semi-conducting layer 210 and the semi-conducting zones 220 have a reverse bias, the semi-conducting layer 210 being thus of the type of conductivity wherein the majority carriers are electrons and the semi-conducting zones 220 being thus of the type of conductivity wherein the majority carriers are holes.

A method of manufacturing a component 2 according to the second embodiment differs from a method of manufacturing a component 2 according to the first embodiment in that the step of forming the first holes consists in forming only a first hole in the insulating layer in communication with the portion of the semi-conducting layer 210 which is intended to form the peripheral contact 233.

In both embodiments of the invention described above, it is contemplated for each of the structures a conducting zone adapted to modify the electromagnetic environment of said structure. It is however contemplatable, without departing from the scope of the invention, that some, or all the structures be free of such a conduction zone 242. According to this possibility, the conducting via 241 of each of the structures not provided with a conducting zone is in direct contact with the bonding zone associated with said structure. The conducting via 241 is in this configuration insulated from the conducting layer 231 by the insulating space 273 which is associated with said structure 201.

The invention claimed is:

1. A semi-conducting component comprising:
   a semi-conducting support including a first face and at least one semi-conducting layer, of a first type of conductivity, a surface of which forms the first face;
   a plurality of optoelectronic diode semi-conducting structures provided in a portion of the semi-conducting layer, each structure including at least one semi-conducting zone of a second type of conductivity opposite the first type of conductivity in such a way to form with the semi-conducting layer a diode;
   an electrically insulating layer, in contact with the first face of the support and extending at least along the portion of the semi-conducting layer;
   a first bias contact to electrically bias the semi-conducting layer along the portion of the semi-conducting layer;
   second bias contacts each associated with a semi-conducting structure and each adapted to electrically contact through the electrically insulating layer to the corresponding semi-conducting zone;
   wherein the first bias contact comprises a conducting layer in contact with the insulating layer on a face of the insulating layer which is opposite the support and which extends along the portion of the semi-conducting layer, the conducting layer including passageway's for each of the second bias contacts with a spacing between the conducting layer and each of the second bias contacts, said spacing located facing the corresponding semi-conducting zone,
   the conducting layer covering at least partly each of the semi-conducting zones.

2. The semi-conducting component according to claim 1, wherein the part of each of the semi-conducting zones which is covered by the conducting layer comprises the part of the space charge region, formed between the semi-conducting zone and the semi-conducting layer, which is in the semi-conducting zone.

3. The semi-conducting component according to claim 2, wherein each of the semi-conducting zones includes a concentration of majority carriers at least 10 times higher than that of the semi-conducting layer, and wherein the conducting layer covers a part of each of the semi-conducting zones which extends from the semi-conducting layer on a dimension of at least 0.1 µm.

4. The semi-conducting component according to claim 1, wherein the first bias contact is adapted to bias the portion of the semi-conducting layer in plural locations.

5. The semi-conducting component according to claim 1, wherein the structures are adapted to operate in a given wavelength range, the conducting layer is made of a material at least partly reflecting in the given wavelength range.

6. The semi-conducting component according to claim 1, wherein each of the second bias contacts includes a conducting via passing through the corresponding passageway of the conducting layer and is in electrical contact with the semi-conducting zone of the structure which is associated with the second bias contacts, each of the conducting vias being electrically separated from the conducting layer by an insulating space which forms the spacing.

7. The semi-conducting component according to claim 6, wherein each of the second bias contacts further includes a conducting zone in the same plane as the conducting layer, the conducting zone being in electrical contact with the conducting via and being electrically separated from the conducting layer by the insulating space.

8. The semi-conducting component according to claim 7, wherein the structures are adapted to operate in a given wavelength range, the conducting zone is made of a material at least partly reflecting in the given wavelength range.

9. The semi-conducting component according to claim 1, wherein each of the structures is a photodiode adapted to operate in the infrared wavelength range.

10. The semi-conducting component according to claim 9, wherein the semi-conducting layer is made of a semi-conductor material with an energy band gap is lower than 1.50V.

11. The semi-conducting component according to claim 10, wherein the semi-conductor material is $Cd_xHg_{1-x}Te$ type mercury-cadmium telluride with x between 1 and 0.

12. The semi-conducting component according to claim 1, wherein the component is adapted to be coupled with a controlling device, each of the second bias contacts including a connecting pad adapted to be connected to a contact of the controlling device.

13. The semi-conducting component according to claim 12, wherein the connection being achieved by indium ball hybridization.

* * * * *